United States Patent [19]

Ooiwa

[11] Patent Number: 5,694,313
[45] Date of Patent: Dec. 2, 1997

[54] RECTIFYING UNIT FOR AC GENERATOR

[75] Inventor: Tooru Ooiwa, Toyota, Japan

[73] Assignee: Nippondenso Co., Ltd., Kariya, Japan

[21] Appl. No.: 657,658

[22] Filed: May 31, 1996

[30] Foreign Application Priority Data

Jun. 2, 1995 [JP] Japan ................................. 7-136707

[51] Int. Cl.[6] .............................. H02M 1/00; H02M 1/10
[52] U.S. Cl. ........................... 363/145; 363/141; 363/144
[58] Field of Search .............................. 363/145, 141, 363/144; 310/68 D

[56] References Cited

U.S. PATENT DOCUMENTS 5,043,614 8/1991 Yockey ..................................... 310/68
5,543,703 8/1996 Kusase et al. ........................... 322/16

FOREIGN PATENT DOCUMENTS 0660501 6/1995 European Pat. Off. .
1130 058 5/1962 Germany .
2640081 3/1977 Germany .

OTHER PUBLICATIONS

Palmour, et al: "6H–Silicon Carbide Power Devices for Aerospace Applications", Proceedings of the 28th Intersociety Energy Conversion Engineering Conference vol. 1, Aug. 8–13, 1993, pp. 1.249–1.254.

Primary Examiner—Peter S. Wong
Assistant Examiner—Rajnikant B. Patel
Attorney, Agent, or Firm—Cushman Darby & Cushman IP Group of Pillsbury, Madison & Sutro LLP

[57] ABSTRACT

A rectifying unit for an alternator is composed of AC input terminal and cooling fins connected to output ends (including a neutral point) of a multi-phase stator coil, a negative-poled cooling fin which is grounded and fixed to a rear cover of the alternator, diodes whose anodes are soldered to the AC input fins and whose cathodes are welded to a positive output terminal, and diodes whose anodes are soldered to a negative-poled fin and whose cathodes are welded to the AC input fins.

18 Claims, 6 Drawing Sheets

RECTIFYING UNIT FOR AC GENERATOR

CROSS REFERENCE TO RELATED APPLICATION

The present application is based on and claims priority from Japanese Patent Applications No. Hei 7-136707, filed on Jun. 2, 1995, the contents of which are incorporated herein by reference.

BACKGROUND OF THE INVENTION

1. Field of the Invention

The present invention relates to a rectifying unit to be mounted to an AC generator for a vehicle.

2. Description of the Related Art

As shown in FIGS. 8 to 10, a conventional rectifying unit mounted to an AC generator has AC input terminals 101~103 connected to output ends of a Y-connected stator coil, a neutral point terminal 104 connected to a neutral point of the stator coil, a negative poled cooling fin 106 fixed to a rear cover 105 of the alternator, rectifying devices 107~110 having anodes connected to the negative poled cathode output fin 106 and cathodes respectively connected to the AC input terminals 101~103 and the neutral point terminal 104, and rectifying elements 112~115 having anodes respectively connected to the AC input terminals 101~103 and the neutral point terminal 104 and cathodes connected to a positive-poled fin 111.

The positive-poled fin 111 is connected electrically to a terminal bolt, and the negative-poled fin 106 is grounded to a generator housing.

In JP-Y2-41-8169, JP-U-58-59363, JP-A-56-29441 and JP-U-56-54871 disclose a rectifying unit which has electrode fins serving as AC input terminals and an electrode fin serving as a neutral point terminal, rectifying elements connected to the electrode fins, a negative-poled terminal for connection of anodes of the rectifying elements with one another, and a positive-poled terminal for connection of cathodes of the rectifying elements with one another.

However, in the above rectifying units, a pair of rectifying elements (e.g. rectifying elements 110 and 115 in FIG. 9) connected to the output fin and electrode fins are arranged different in polarity from each other.

Consequently, in the case where the rectifying elements are potted diodes, it is necessary to provide two kinds of diodes (one whose anode is a container and the other whose anode is a terminal) and dispose the correct one at a predetermined place at the time of mounting.

In the case where the rectifying elements are silicon chips, it is necessary to first discriminate the polarity and thereafter install them into the unit in the same direction or in the opposite direction.

Thus, no matter whether the installation is made by an automatic machine or manually, the above installation process markedly deteriorates productivity.

Further, heat radiation from the rectifying elements is effected by the four electrode fins which are floated electrically from the generator housing. Therefore, the size of each electrode fin cannot be made small because the size corresponds to the heat radiating property.

Moreover, once a conduction path is formed between the positive-poled fin 111 and the generator housing by an inspection tool, a tester bar, or the like while maintenance or inspection (engine stop) is being carried out, short-circuit current may flow which causes problems with the wire and the battery.

SUMMARY OF THE INVENTION

Therefore, it is a main object of the present invention to provide a new and improved rectifying unit for a vehicular AC generator which has rectifying elements of equal polarity, thereby to improve the productivity.

Another object of the present invention is to provide a rectifying unit for an AC generator having a stator coil comprising a plurality of AC input terminals respectively connected to output ends of the stator coil, a positive output terminal, a negative output terminal, a plurality of first rectifying elements respectively mounted on the AC input terminals and each having an input electrode connected to the AC input terminals and an output electrode connected to the positive output terminal and a plurality of second rectifying elements mounted on the negative output terminal and each having an input electrode connected to the negative output terminal and a second electrode connected to one of the AC input terminals.

Therefore, the first and second rectifying elements have the same polarity direction and, consequently, all the rectifying elements of the same structure can be mounted in the same direction, thus facilitating the assembling work and improving the productivity. Further, it is not necessary to produce and manage two kinds of rectifying elements.

In the above rectifying unit, each of the AC input terminals may have a first cooling fin and the negative output terminal may have a second cooling fin.

Consequently, it is possible to enhance the freedom of fin arrangement (because the AC input fins can be made smaller in size) and reduce the space occupied by the rectifying unit (dead space can be utilized effectively and the reduction in size of the AC generator is attainable). Even if a conduction path is formed between the AC input fins and the housing by an inspection tool, a tester bar, or the like, during maintenance and inspection, a short-circuit current does not flow because the first rectifying elements are present, thus preventing burning of the wire and breakage of the battery. In addition, since no voltage is applied to the AC input terminal when the AC generator does not generate, electrolytic corrosion can be prevented without specific insulation treatment, thereby increasing cooling ability.

The rectifying unit may further include first and second cooling fins fixed to the housing, and the AC input terminals and negative output terminal may be disposed on the cooling fins through an insulating member, each of the first rectifying elements may be mounted on one of the AC input terminals, and each of the second rectifying elements may be mounted on the negative output terminal. The second cooling fin is preferably larger in size and thicker than the first cooling fin to enhance vibration resistance.

Since plural rectifying elements are mounted on a single cooling fin, it is possible to reduce the volume occupied by the rectifying unit (the reduction in size of the AC generator can be attained) and high vibration resistance is obtained.

This construction is particularly suitable for the case where the rectifying elements are thin and light-weight, for example in the form of silicon chips.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

The following description is now provided about a first embodiment of the present invention with reference to FIGS. 1 to 4.

Figure 1:
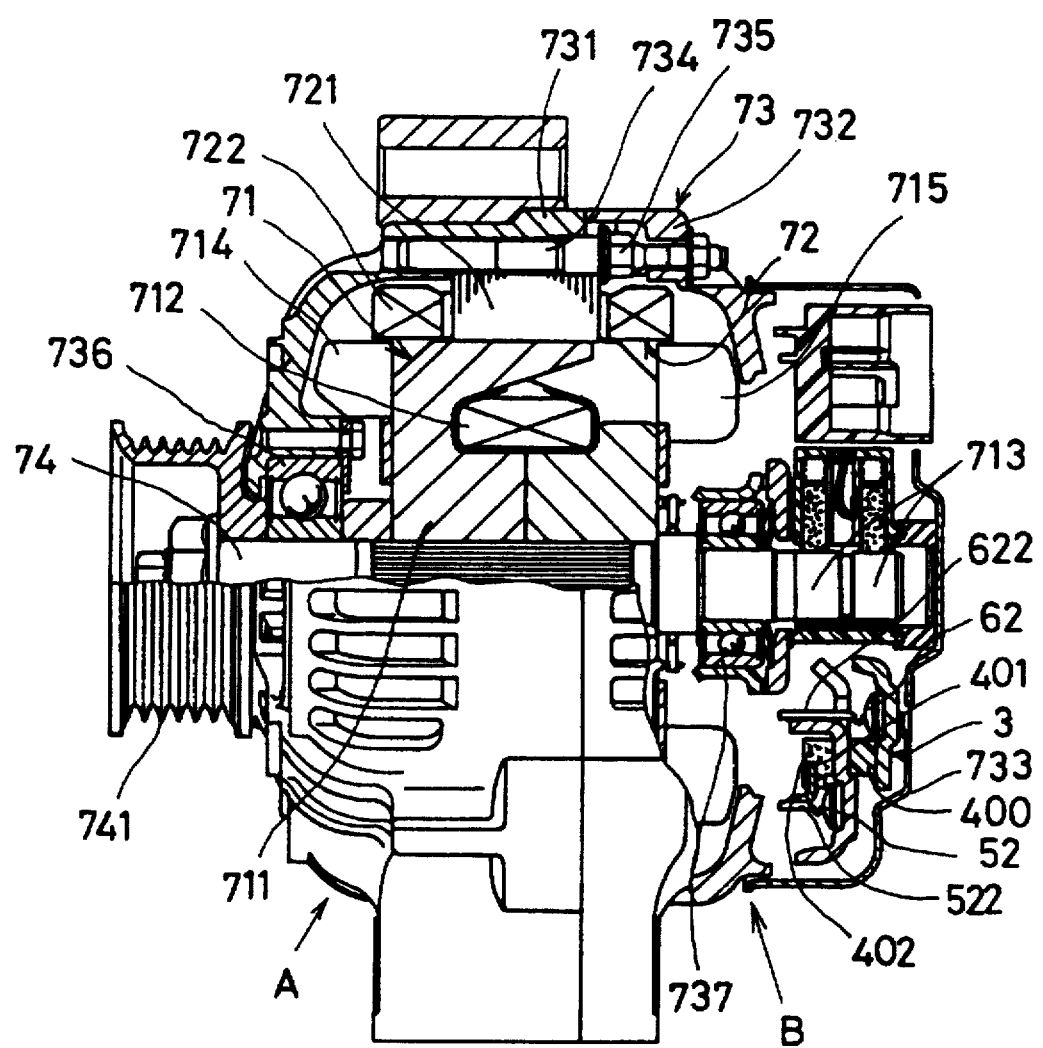
FIG. 1 is a partially cross-sectional view showing an alternator with a rectifying unit according to a first embodiment of the present invention mounted thereto.

A rectifying unit B mounted to an alternator A, both shown in FIG. 1, has a negative-poled fin 3, AC input fins 41, 42, 43 and 44, potted diodes 51, 52, 53 and 54 as first rectifying elements, and potted diodes 61, 62, 63 and 64 as second rectifying elements.

The alternator A, which has a rotor 71, a stator 72 and a housing 73, is driven by an engine to generate electric power and charge a vehicular battery for the supply of electric power to an electrical load.

The rotor 71, which supplies a magnetic field, rotates integrally with a shaft 74. The rotor 71 has a Lundell type pole core 711, a field coil 712 and slip rings 713.

A V-ribbed pulley 741 for transfer of the rotating power of the engine is mounted to the front end of the shaft 74. The V-ribbed pulley 741 is connected to a pulley which is mounted to an output shaft of the engine through a belt.

The pole core 711 accommodates the field coil 712 therein and has cooling fans 714 and 715 respectively in front and in the rear thereof.

The slip rings 713 are formed on a rear end of the shaft 74 on which brushes are slidably disposed.

The stator 72 is composed of a stator core 721 disposed around the outer periphery of the pole core 711 and a three-phase Y-connected stator coil 722 wound in the stator core 721.

The stator core 721 is a laminate of plural sheets formed of a magnetic material, which is press-fitted in the inner periphery of a front housing 731. Magnetic flux from the pole core 711 intersects the stator coil 722 to induce electromotive force.

Three-phase alternating current is supplied from the output ends and neutral points of the Y-connected stator coil 722 which are respectively connected to AC input terminals 411, 421, 431 and 441 of the AC input fins 41, 42, 43 and 44.

The housing 73 has a front housing 731, a rear housing 732, both formed by die casting of aluminum, and a rear cover 733 fixed to the rear housing 732. The front housing 731 and the rear housing 732 are clamped together by a plurality of stud bolts 734 and nuts 735.

A pair of bearings 736 and 737 are disposed in the front portion of the front housing 731 and in the rear portion of the rear housing 732 respectively to support the shaft 74 rotatably.

The negative-poled fin 3, which is formed of a highly heat-conductive metal such as copper for example, assumes a generally horseshoe shape and is grounded and fixed to the rear cover 733. The negative-poled fin 3 has concave portions 31 for mounting the potted diode 62 as shown in FIG. 3 and also diodes 61, 63 and 64.

The AC input fins 41–44, which are formed of a highly heat-conductive metal such as copper for example, assume a generally sectorial shape and are arranged spacedly in a radial plane in opposed relation to the negative-poled fin 3 through an insulating member 400 which will be described later. Since the AC input fins 41–44 are electrically insulated from the rear cover 733, not much radiation of heat to the rear cover by the heat conduction can be expected. For this reason those fins are arranged so as to be effectively exposed to the cooling air created by the cooling fan 715.

Figure 2:
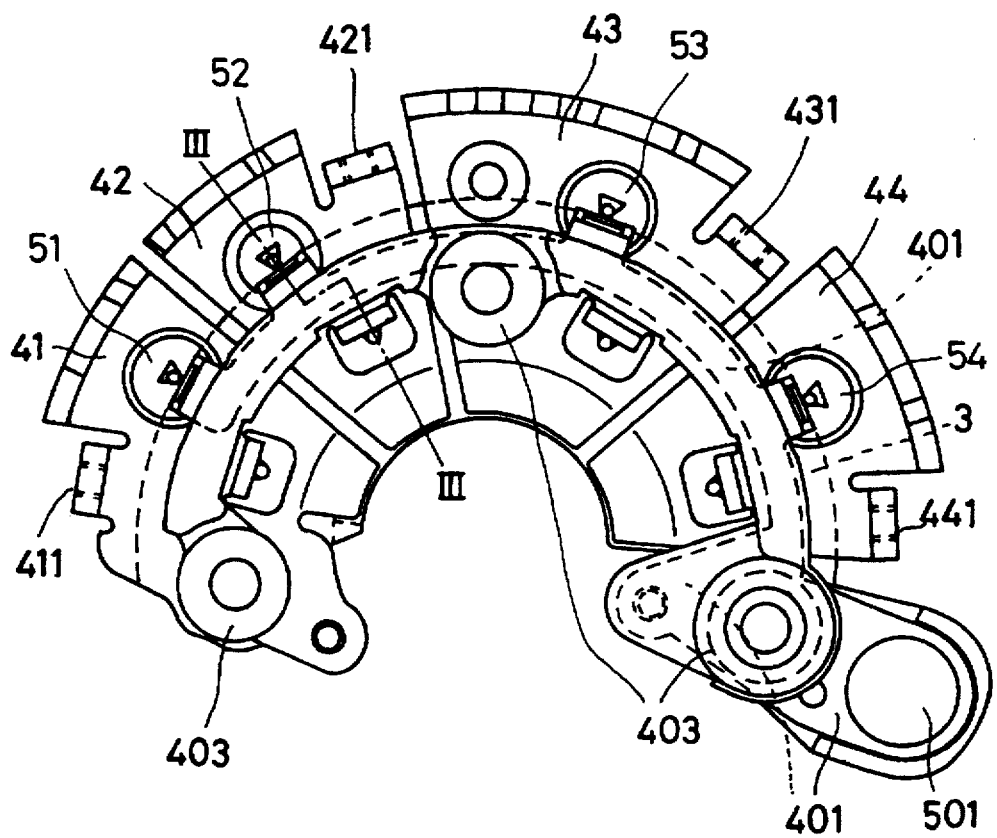
FIG. 2 is plan view showing a the rectifying unit of the first embodiment.
Figure 3:
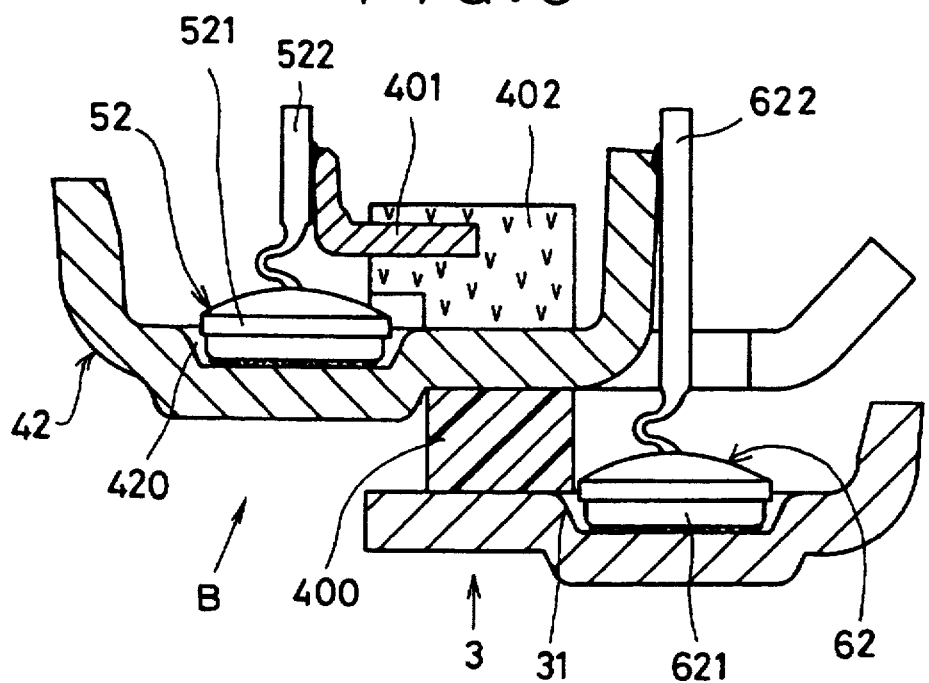
FIG. 3 is a partially cross-sectional view taken on line III—III in FIG. 2.
Figure 4:
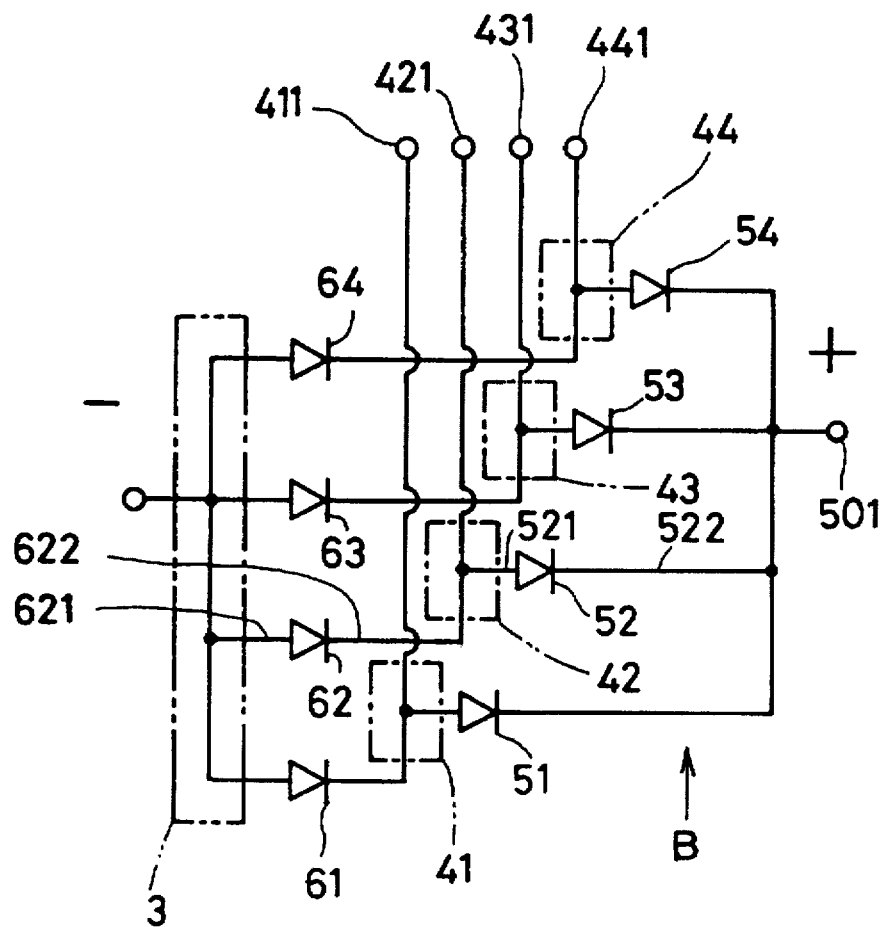
FIG. 4 is a circuit diagram of the rectifying unit according to the first embodiment.

As shown in FIG. 3, the AC input fin 42 (and fins 41, 43 and 44 as shown in FIG. 2) has a concave portion 420 for mounting of the potted diode 52 (and also potted diodes 51, 53 and 54). Further, the AC input fins 41–44 are provided with AC input terminals 411, 421, 431 and 441 for connection of the output ends and the neutral point of the stator coil 722.

The potted diode 52 (and also diodes 51, 53 and 54) has a container 521 formed of a highly heat-conductive metal such as copper for example and a rectifying device sealed hermetically within the container using silicon rubber. The container 521 serves as an anode, while a lead electrode 522 serves as a cathode.

The container bottom 521 of the potted diode 52 (51, 53, 54) is soldered to the concave portion 420, and each lead electrode 522 is welded to a terminal strip 401 which is connected electrically to a positive-poled bolt 501.

The insulating member 400 for insulation between the AC input fins 41–44 and the negative-poled fin 3, and a terminal block 402 for insulating and supporting the terminal strip 401 are fixed to the negative-poled fin 3 with pipe rivets 403 extending from the terminal block 402 into the fin 3. The negative poled fine is larger in size and thicker than any one of the AC input fins 41–44.

The potted diode 62 (and also the potted diodes 61, 63 and 64), like the potted diodes 51–54, has a container 621 formed of a highly heat-conductive metal such as copper for example and a rectifying device sealed hermetically within the container using silicon rubber. The container 621 serves as an anode, while a lead electrode 622 serves as a cathode.

The container bottom of the potted diode 62 (and also diodes 61, 63, 64) is soldered to a concave portion 31 of the negative-poled fin 3, while the lead electrode 622 is welded to the AC input fin 42.

In summary, the container bottom (anode side) of the potted diode 52 (51, 53, 54) is soldered to the AC input fin 42 (41, 43, 44), the lead electrode 522 is welded to the terminal strip 401, the container bottom (anode) of the potted diode 62 (61, 63, 64) is soldered to the negative-poled fin 3, and the lead electrode 622 is welded to the AC input fin 42. Accordingly, all the potted diodes of the same structure can be mounted in the same direction. The container bottoms (anode) of the potted diodes 61–64 are soldered to the negative-poled fin 3 which is grounded and fixed to the rear cover 733 to radiate heat from the potted diodes 61–64.

Further, the radiation of heat from the potted diodes 51–54 is effected by the four AC input fins 41–44 which are exposed effectively to the cooling air driven by the cooling fan 715. Accordingly, the AC input fins 41–44 can be reduced in size and dead space can be utilized effectively.

If a conduction path is formed between the AC input fins 41–44 and a housing member such as the rear cover 733 by an inspecting tool, a tester bar, or the like, the flow of a short-circuit current is prevented by the presence of the potted diodes 51–54.

The second embodiment of the present invention will be described below with reference to FIG. 5.

Figure 5:
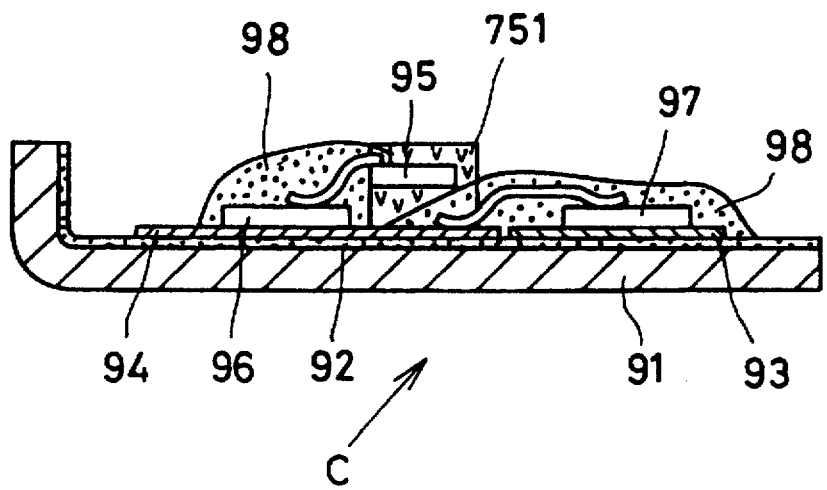
FIG. 5 is a partially cross-sectional view showing a main part of a rectifying unit according to a second embodiment of the present invention.

As shown in FIG. 5, a rectifying unit C has a cooling fin 91, a negative terminal 93 and four AC input electrodes 94 formed on the cooling fin 91 through an insulating layer 92, four silicon chips 96 each anode of which is soldered to one of the four AC input electrodes 94, respectively, and all cathodes of which are wire-bonded to a metallic positive terminal piece 95, and four silicon chips 97 all anodes of which are soldered to the negative terminal 93 and each cathode of which is connected electrically to one of the four AC input electrodes 94.

The cooling fin 91 is a metallic plate formed of a highly heat-conductive metal such as copper for example and is grounded and fixed to a housing member of an AC generator.

The insulating layer 92 is formed by a thin epoxy resin or ceramic vapor-deposited film superior in thermal conductivity.

The negative terminal 93 and the AC input electrodes 94 are formed of a material superior in electrical conductivity such as copper plate, copper vapor-deposited film, or copper foil.

The metallic positive terminal piece 95 is molded into an insulating terminal block 751 which is fixed to the cooling fin 91 with pipe rivet.

The silicon chips 96 and 97 and the wire-bonded portions are sealed with silicone rubber 98.

Although in this embodiment the metallic positive terminal piece 95 is molded into the insulating terminal block 751 which is fixed to the cooling fin 91 with pipe rivet, a positive output electrode corresponding to the metallic positive terminal piece 95 may be formed on the insulating layer 92 like the negative terminal 93 and the AC input electrodes 94. Also, the positive output electrode may be formed on the insulating layer 92, and the metallic negative terminal piece may be molded into the insulating terminal block 751.

Since the rectifying elements are silicon chips which are thin and light-weight, the silicon chips 96 and 97 can be attached by soldering onto the negative terminal 93 and the four AC input electrodes 94 both formed on the cooling fin 91 through the insulating layer 92. Only one cooling fin is necessary in this embodiment, thereby decreasing the volume around the silicon chips and increasing resistance to vibration.

Figure 6:
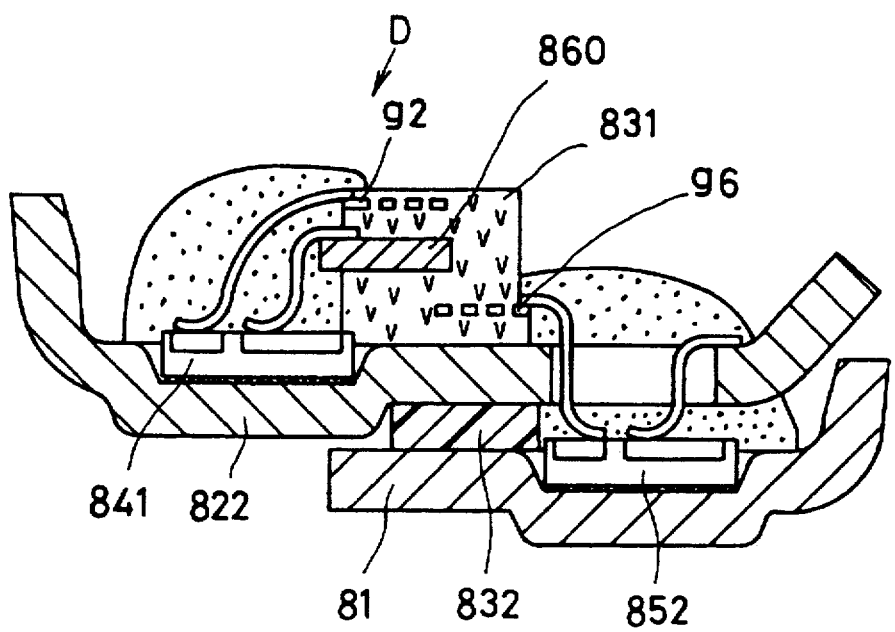
FIG. 6 is a partially cross-sectional view showing a main part of a rectifying unit according to a third embodiment of the present invention.
Figure 7:
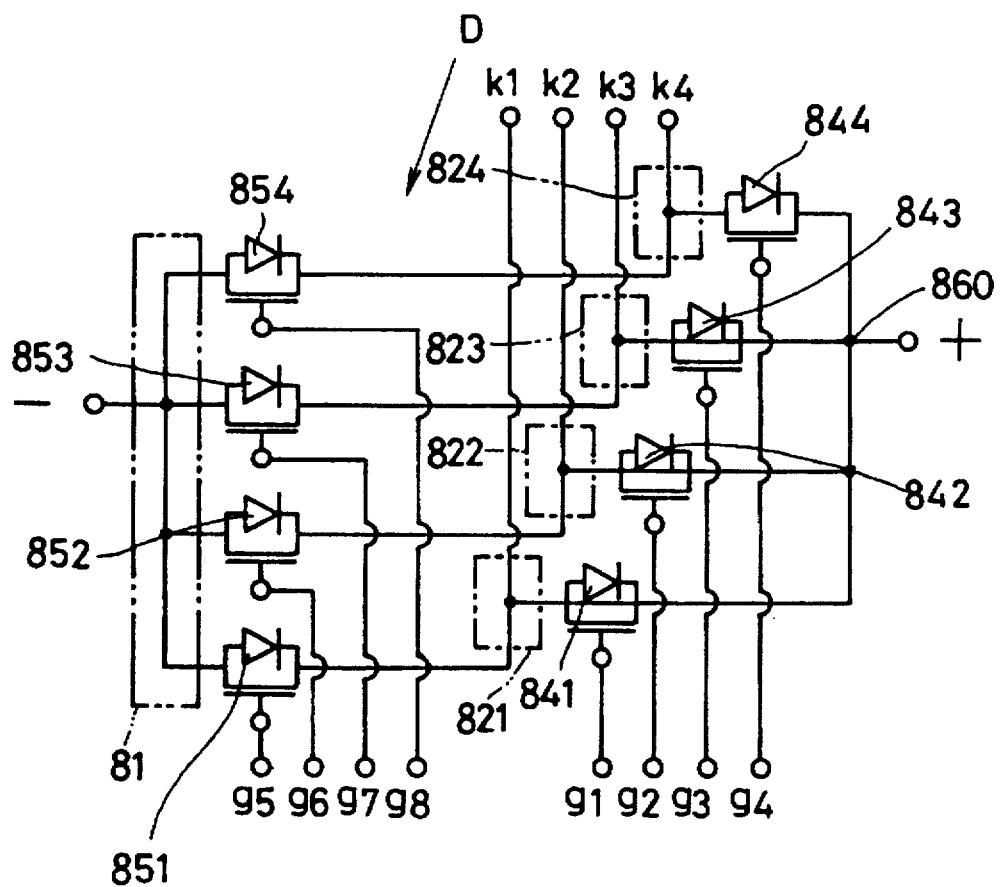
FIG. 7 is a circuit diagram of the rectifying unit according to the third embodiment.
Figure 8:
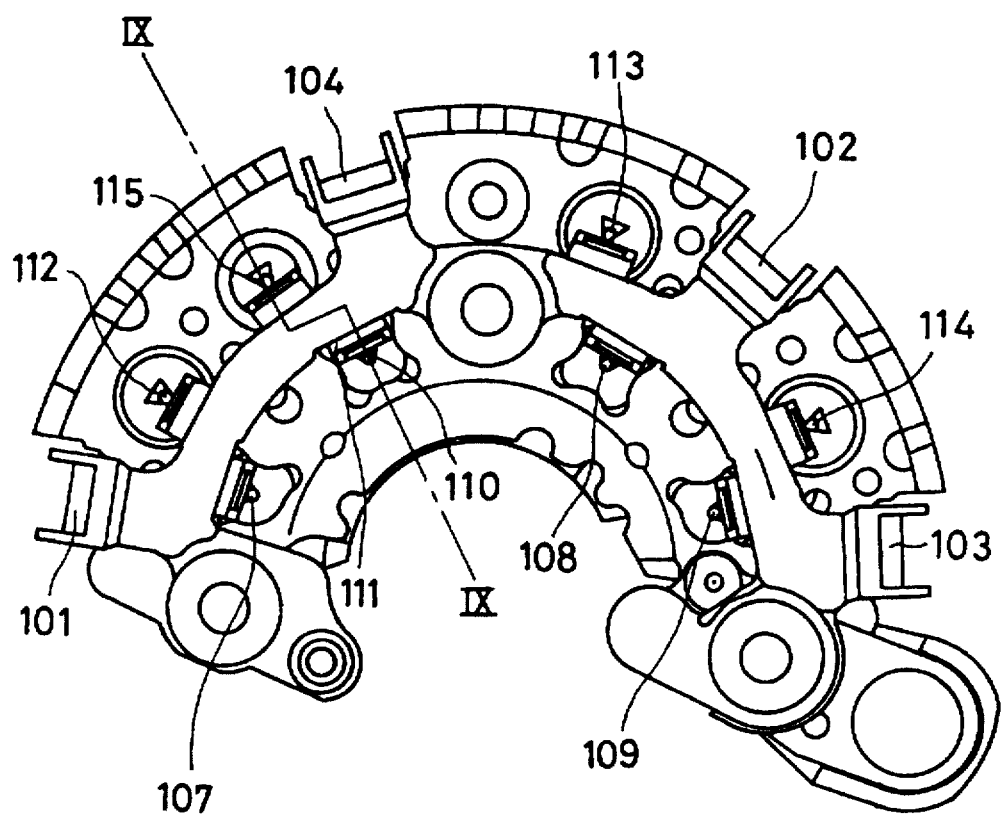
FIG. 8 is a plan view showing a conventional rectifying unit.
Figure 9:
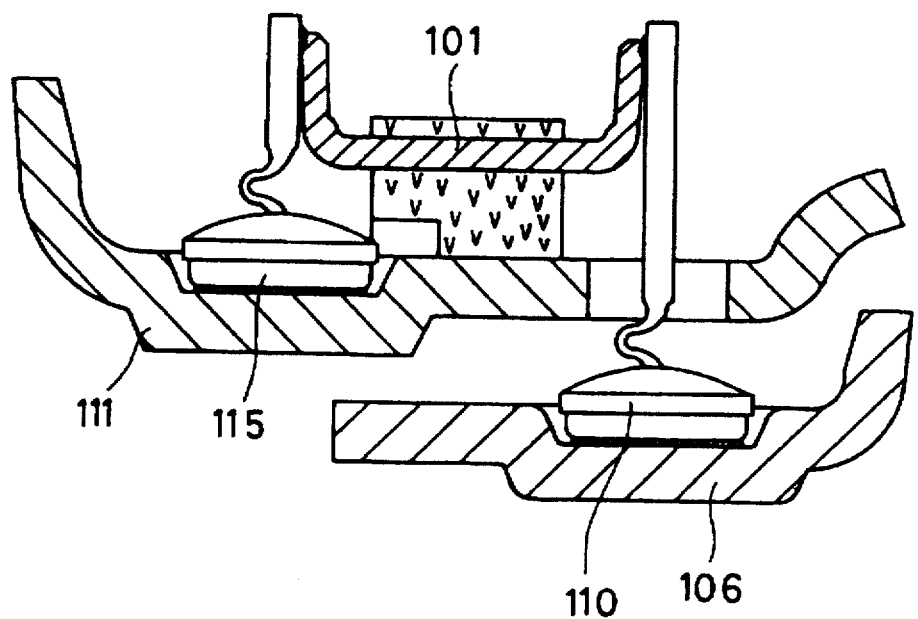
FIG. 9 is a partially cross-sectional view taken on line IX—IX in FIG. 8.
Figure 10:
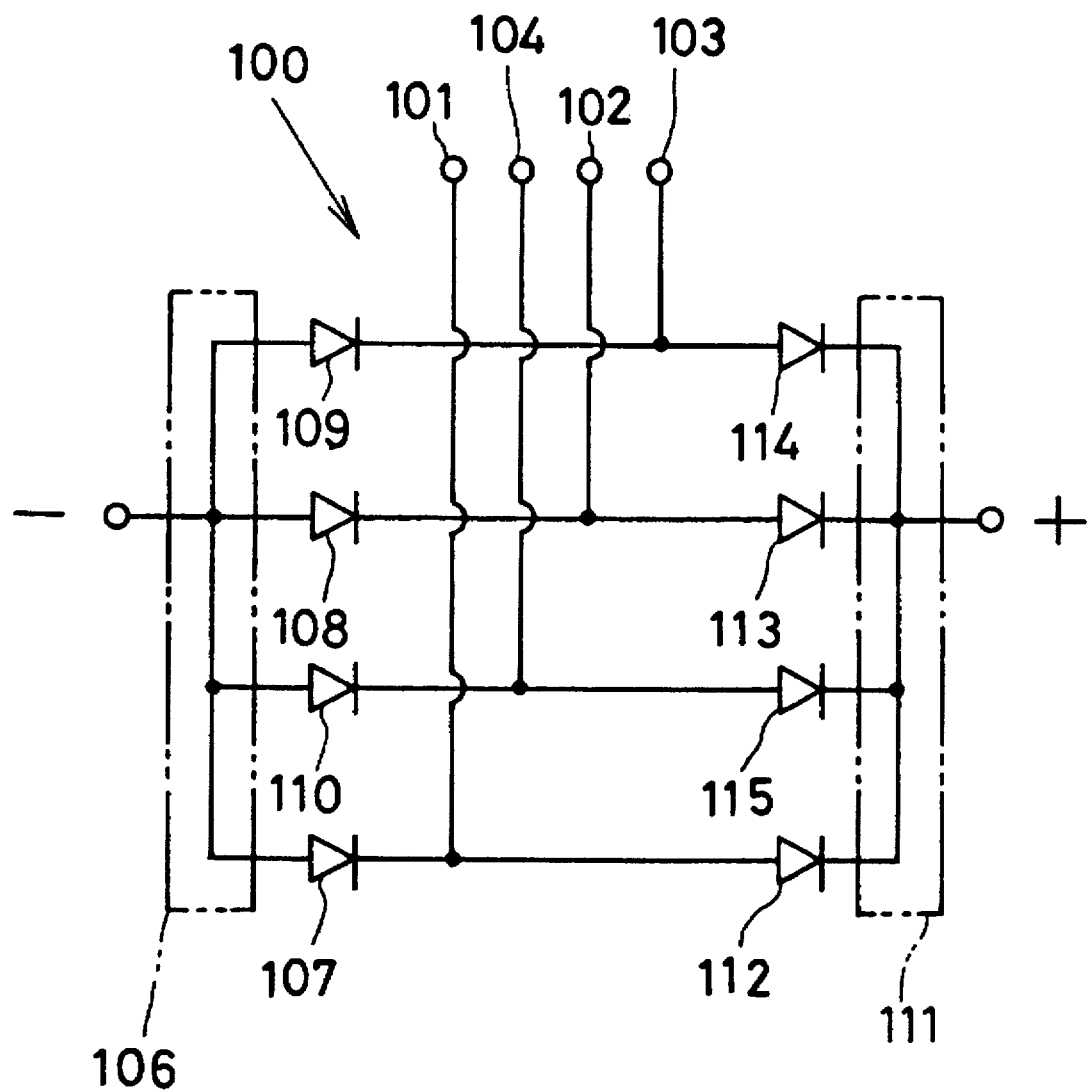
FIG. 10 is a circuit diagram of the conventional rectifying unit.

Description is now directed to the third embodiment with reference to FIGS. 6 and 7.

As shown in FIGS. 6 and 7, a rectifying unit D is composed of a negative-poled fin 81, AC input fins 821–824, four insulating terminal blocks 831 for insulation and arrangement of gate terminals g1–g8 and a metallic positive terminal piece 860, the gate terminals g1–g8 being each connected to a gate circuit, four insulating members 832 for insulation of the AC input fins 821–824 and the negative-poled fin 81 from each other, SiC-MOSFETs 841–844 which constitute first rectifying elements, and SiC-MOSFETs 851–854a second rectifying elements.

The insulating members 832 for insulation between the AC input fins 821–824 and the negative-poled fin 81, and the terminal block 831 for insulating and supporting the terminal piece 860, are each fixed to the negative-poled fin 81 with pipe rivet extending from the terminal block 831 into the fin 81.

In the SiC-MOSFETs, their sources (bottoms) are soldered to concave portions of the AC input fins 821–824, their drains are connected to the metallic positive terminal piece 860 electrically by wire bonding, and their gates are connected electrically to the gate terminals g1–g4.

In the SiC-MOSFETs 851–854, their sources (bottoms) are each soldered to a recess of the negative-poled fin 81, their drains are connected to AC input terminals k1–k4 electrically by wire bonding, and their gates are connected to the gate terminals g5–g8 electrically by wire bonding.

In this embodiment reversed source-drain relation may be also applicable. That is, each drain (bottom) is soldered onto the positive-poled fin and AC input fin, and the negative-poled terminal is disposed on the insulating terminal block.

The SiC-MOSFETs 841–844, 851–854, and the wire bonding portions are sealed with a sealing material such as silicone rubber for example. A resin superior in adherence such as an epoxy resin for example can be used in place of the silicone rubber.

Since the SiC-MOSFET is low in its on-resistance, the amount of heat generated is small. Consequently, the negative-poled fin 81 and the AC input fins 821–824 may be small in size.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A rectifying unit for an AC generator having a stator coil with output ends comprising:

a plurality of AC input terminal members respectively connected to said output ends of said stator coil;

a first DC output terminal member;

a second DC output terminal member;

a plurality of first rectifying elements respectively mounted on said AC input terminal members, each of said first rectifying elements having an input electrode directly connected to one of said AC input terminal members and an output electrode directly connected to said first DC output terminal member; and a plurality of second rectifying elements mounted on said second DC output terminal member, each of said second rectifying elements having an input electrode directly connected to said second DC output terminal member and an output electrode directly connected to one of said AC input terminal members, said second rectifying elements having the same structure and polarity as said first rectifying elements;

wherein
said first DC output terminal member comprises a single conductor member disposed near said first rectifying elements; and
said second DC output terminal member comprises a single cooling fin.

2. The rectifying unit as claimed in claim 1, wherein:
each of said AC input terminal members comprises a cooling fin; and
said first DC output terminal member is larger in size and thicker than each cooling fin of said AC input terminal members.

3. The rectifying unit according to claim 1, wherein:
each of said first rectifying elements and said second rectifying elements comprises a semiconductor switching element.

4. The rectifying unit according to claim 3, wherein:
each of said first rectifying elements and said second rectifying elements comprises an SiC-MOSFET.

5. A rectifying unit for an AC generator having a housing, a multi-phase stator coil and a cooling fan comprising:
a positive output member;
a negative output member having a generally horseshoe-shape cooling fin directly fixed to said housing;
a plurality of AC input terminals of generally sectorial shape disposed in a radial plane near said cooling fan in opposed relation to said negative output member and connected respectively to output ends of said multi-phase stator coil;
a plurality of first rectifying elements each of which is mounted on one of said AC input terminals and has an input electrode connected to said one of said AC input terminals and an output electrode connected to said positive output member; and
a plurality of second rectifying elements each of which is mounted on said negative output member and has an input electrode connected to said negative output member and an output electrode connected to one of said AC input terminals, said second rectifying elements having the same structure and polarity as said first rectifying elements;
wherein
said positive output member comprises a single member disposed near said first rectifying elements, and
said negative output terminal comprises a single cooling fin.

6. The rectifying unit according to claim 5, wherein:
each of said first rectifying elements and said second rectifying elements comprises a semiconductor switching element.

7. The rectifying unit according to claim 5, wherein:
each of said first rectifying elements and said second rectifying elements comprises an SiC-MOSFET.

8. The rectifying unit according to claim 5, wherein:
each of said first rectifying elements and said second rectifying elements comprises a potted diode having a container and a lead.

9. The rectifying unit according to claim 8, wherein:
said container is connected to an anode of said diode.

10. The rectifying unit according to claim 5, further comprising:
an insulating member disposed between said AC input terminals and said negative output member;
a terminal block; and
an output bolt;
wherein said positive output member comprises a terminal strip supported by said terminal block for connecting said output electrode of said first rectifying element and said output bolt.

11. The rectifying unit according to claim 1, wherein:
said second rectifying elements are hermetically sealed by insulating material.

12. A rectifying unit for an AC generator having a stator coil comprising:
a plurality of AC input terminals respectively connected to output ends of said stator coil;
a first DC output terminal;
a second DC output terminal;
a plurality of first rectifying elements respectively mounted on said AC input terminals and each of said first rectifying elements having an input electrode connected to a respective one of said AC input terminals and an output electrode connected to said first DC output terminal; and
a plurality of second rectifying elements mounted on said second DC output terminal and each of said second rectifying elements having an input electrode connected to said second DC output terminal and an output electrode connected to a respective one of said AC input terminals;
wherein said AC input terminals and said second DC output terminal are respectively disposed on a single cooling fin through an insulating member.

13. The rectifying unit according to claim 12, wherein:
said first DC output terminal member is connected to a plus terminal of a battery; and
said second DC output terminal is connected to a minus terminal of said battery.

14. The rectifying unit according to claim 12, wherein:
said second rectifying elements are hermetically sealed by insulating material.

15. A rectifying unit for an AC generator having a stator coil comprising:
a plurality of AC input terminals respectively connected to output ends of said stator coil;
a first DC output terminal;
a second DC output terminal; and
a plurality of same-type semiconductor elements, each of said semiconductor elements having a control gate and a pair of electrodes disposed on opposite sides thereof;
wherein
half of said semiconductor elements are respectively mounted and connected to said AC input terminals by one side of said semiconductor elements and directly connected to said first DC output terminal by the other side of said semiconductor elements;
the other half of said semiconductor elements are mounted on and directly connected to said second DC output terminal by one side of said semiconductor elements and respectively connected to said AC input terminals by the other side of said semiconductor elements; and
said first DC output terminal is disposed near said half of said semiconductor elements.

16. The rectifying unit according to claim 15, wherein:
each of said semiconductor elements comprises a MOSFET; and
said pair of electrodes of each of said semiconductor elements comprises a drain and a source.

17. The rectifying unit according to claim 16, wherein:
each of said half of said MOSFETs are respectively mounted and connected to said AC input terminals by said source and connected to said first DC output terminal by said drain.

18. The rectifying unit according to claim 17, wherein:
said first DC output terminal is connected to a plus terminal of a battery; and said second DC output terminal is connected to a minus terminal of said battery.

* * * * *